United States Patent [19]

Kalb, Jr.

[11] Patent Number: 5,742,177

[45] Date of Patent: Apr. 21, 1998

[54] METHOD FOR TESTING A SEMICONDUCTOR DEVICE BY MEASURING QUIESCENT CURRENTS (IDDQ) AT TWO DIFFERENT TEMPERATURES

[75] Inventor: Jeffrey C. Kalb, Jr., Phoenix, Ariz.

[73] Assignee: Intel Corporation

[21] Appl. No.: 705,844

[22] Filed: Sep. 27, 1996

[51] Int. Cl.$^6$ .......................... G01R 31/26; G01N 25/72
[52] U.S. Cl. .................. 324/765; 324/760; 324/522; 324/537; 437/8; 374/4
[58] Field of Search ............ 374/4, 6, 7; 324/765, 324/760, 537, 522; 437/8; 257/48

[56] References Cited

U.S. PATENT DOCUMENTS

| | | | |
|---|---|---|---|
| 4,862,069 | 8/1989 | Albee | 324/522 |
| 5,057,774 | 10/1991 | Verhelst et al. | 324/537 |
| 5,332,973 | 7/1994 | Brown et al. | 324/537 |
| 5,420,522 | 5/1995 | Smayling | 324/765 |
| 5,554,941 | 9/1996 | Kesel | 324/765 |
| 5,570,034 | 10/1996 | Needham et al. | 324/765 |
| 5,625,300 | 4/1997 | Sachdev | 324/765 |

OTHER PUBLICATIONS

David G. Edwards, *Testing For MOS Integrated Circuit Failure Modes*, IEEE, Reprint from Proceedings International Test Conference 1980, pp. 303–312.

Thomas M. Storey and Wojciech Maly, *CMOS Bridging Fault Detection*, IEEE, Reprint from Proceedings International Test Conference, 1990, pp. 325–334.

Robert C. Atken, *A Comparison of Defect Models For Fault Location With IDDQ Measurements*, IEEE, Reprint from Proceedings International Test Conference 1992, pp. 335–344.

Charles F. Hawkins and Jerry M. Soden, *Electrical Characteristics and Testing Considerations For gate Oxide Shorts In CMOS ICs*, IEEE, Reprint from Proceedings International Test Conference 1995, pp. 313–324.

*Primary Examiner*—Diego F. F. Gutierrez
*Attorney, Agent, or Firm*—Blakely, Sokoloff, Taylor & Zafman

[57] ABSTRACT

A method for detecting defects in a semiconductor device using an IDDQ testing technique that is not dependent upon the background leakage current for defect resolution. One embodiment of the present invention utilizes the dependence of the background leakage current on temperature and/or voltage to zero out the background leakage in determining the defect current of a device.

3 Claims, 3 Drawing Sheets

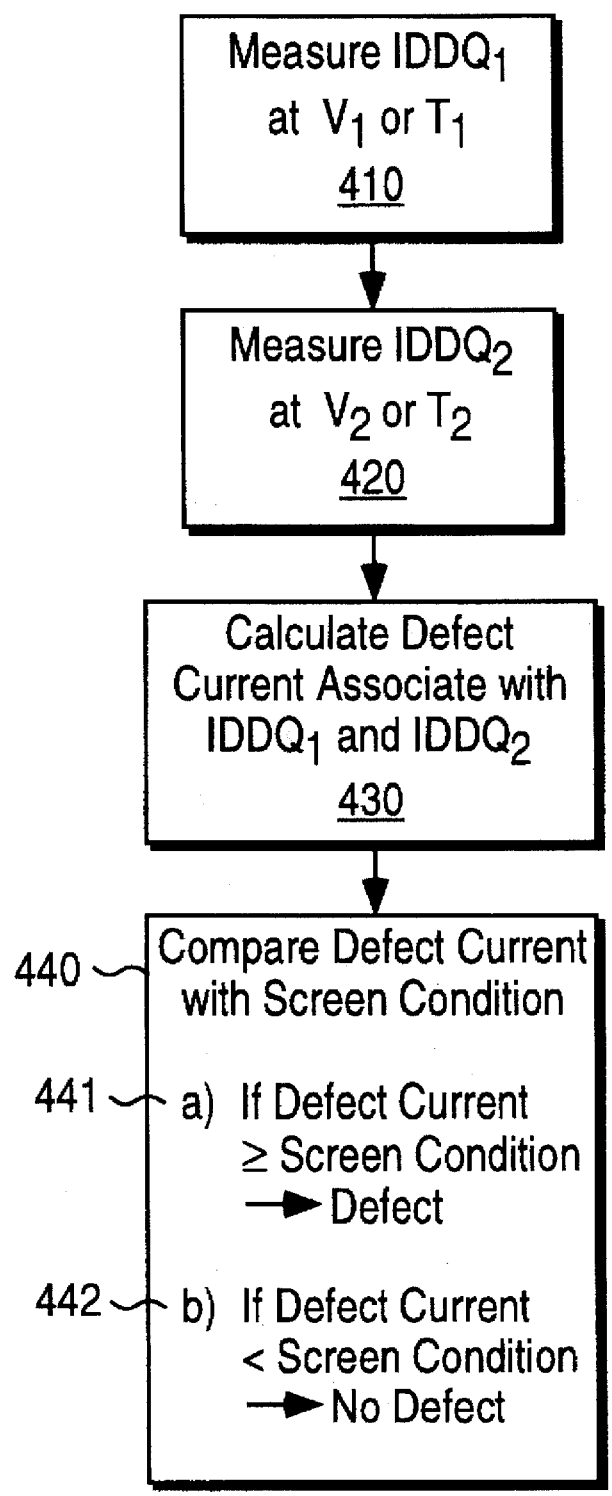

METHOD FOR TESTING A SEMICONDUCTOR DEVICE BY MEASURING QUIESCENT CURRENTS (IDDQ) AT TWO DIFFERENT TEMPERATURES

FIELD OF THE INVENTION

This invention relates to the field of testing semiconductor devices for defects, and more specifically, to methods for detecting defects in a semiconductor device by leakage zeroing using the temperature or voltage dependence of IDDQ measurements.

BACKGROUND OF THE INVENTION

In the manufacture of semiconductor devices it is important to have methods for testing a device and determining if it is a good device or if it contains defects before selling such a product to a customer. If the results of the test are within a manufacturer's tolerance levels then the device is presumably a good or non-defective device and may be sold to a customer. If the results are not the same and are not within the manufacturer's tolerance levels then the device is a defective device and cannot be sold to a customer.

One particular method for testing a device for defects is called IDDQ Testing. In a CMOS device when the clock is stopped, the device is said to be in a quiescent state, thus the current in the device is called drain to drain quiescent current (IDDQ). IDDQ derives from quiescent IDD which is the current drawn by the Vdd power supply. The Vdd supply is typically held at a voltage above ground and fixed within narrow bounds. The other supply is typically called Vss and is taken to be ground (i.e. arbitrarily assigned a value of zero electrical potential. In IDDQ testing, a device is tested by measuring the current while the device is in the quiescent state. Since defects often result in significant leakage currents, measuring the quiescent current allows defects such as open and short circuits to be detected. If the IDDQ is above a preset threshold, then the device is termed "defective" and is not sold to the customer.

Prior methods for IDDQ testing require a low background leakage current while in the quiescent state. In such prior methods, the background leakage current is typically required to be less than a few hundred microamps (μA). As is illustrated in FIG. 1, a statistical sample of devices under test (DUTs) is taken in order to determine a median background leakage current 110. Once a median background leakage current is established then an IDDQ pass/fail limit 120 is set. The pass/fail limit must be set such that it is greater than the median background leakage current but such that it is less than the average current caused by a device defect. Typically in prior methods the pass/fail limit is set at a current much higher than the median, usually from three (3) to six (6) standard deviations greater than the median background leakage current. For example, the pass/fail limit may be in the range of approximately 500 microamps (μA) to 1.5 milliamps (mA). Any device exhibiting an IDDQ current greater than the pass/fail limit is assumed to be a defective device 130 and is not sold to a customer.

One of the problems with prior art methods for IDDQ testing is that they can only detect defects where the defect causes an IDDQ current larger than the background leakage current. As device dimensions of semiconductor devices become smaller and more dense, the background leakage current increases in relation to the defect currents which must be resolved.

This increase in background leakage current can be traced to several factors. The most prominent of these are the increase in the number of devices on a single substrate and an increase in the subthreshold leakage across a given device as the length of its polysilicon gate decreases. The latter, in turn, can be divided into several components, each of which contributes a share to the total current. For example in submicron CMOS devices, background leakage currents in the range of approximately several tens of milliamps (mA) are likely due to the short channel lengths.

As is illustrated in FIG. 2, a wider distribution in background leakage current makes resolution of the same level of defect current problematic. Since the background leakage is higher, the pass/fail limit 220 must be increased proportionately to avoid the improper rejection of functional devices. Meanwhile, the standard deviation of the background leakage 230 has increased sufficiently to make resolution of smaller defect currents impossible.

An additional problem with current IDDQ testing is the variability of the background leakage current from wafer to wafer and from device to device within a wafer. In an ideal case, for example, the background leakage in a wafer should be $I_1$ if there are no defects. When measuring the current of that wafer a different current $I_2$ which is in excess of $I_1$ is measured do to the existence to one or more defects. This difference in currents is attributable to the defect equal to $I_2-I_1$. This is a magnitude which can be differentiated on a tester. The problem, however, is not solving this differential between the magnitude of the defects, but rather is determining the actual background leakage current when shifting from wafer to wafer. For example, wafer1 may have a background current of $I_1$, wafer2 may have a current of $I_2$, and wafer3 may have a background current of $I_3$.

Currently, an average or median is calculated for the background leakage current for a number of wafers. As illustrated in FIGS. 3a and 3b, the number of wafers measured may vary. The fewer number of wafers measured in FIG. 3a exhibits a magnitude 310a and a variability 320a. The variability 320a is illustrated by the difference between the sides of the bell curve. In FIG. 3b, a larger number of wafers are measured and although the magnitude 310b is lower than the magnitude 310a of FIG. 3a, the variability 320b is twice as large as the variability 320a, in FIG. 3a. In other words, from FIGS. 3a and 3b, it can be observed that a given defect can be resolved only if the additional current due to the defect ($I_2-I_1$) is significantly greater than the standard deviation of the background leakage current over the sample size. As illustrated in FIGS. 3a and 3b, while the distribution in FIG. 3b has an identical mean value ($I_{average}$) as the distribution in FIG. 3a, its higher standard deviation makes the resolution of some of the defects nearly impossible. Thus, the larger number of wafers tested the larger the variability of the background leakage current from wafer to wafer.

When testing devices for defects, if the background leakage current was the same from wafer to wafer, it would be relatively simple to set the pass/fail criteria for determining if a device defect exists. For example, if it is known that every device on every wafer being tested has a background leakage current of 5.0 mA, whatever is in excess of 5.0 mA would necessarily correspond to a defect. For instance, an IDDQ measurement of a device is determined to be 5.2 mA. The portion of that IDDQ measurement attributable to the background leakage current is 5.0 mA, and the remaining 0.2 mA (200 μA) is attributable to a defect. However, as is illustrated in FIGS. 3a and 3b, the background leakage current varies from wafer to wafer. This variability of the background leakage current from wafer to wafer may cause considerable problems in determining if a defect exists from one wafer to the next.

In the prior art a mean (or average) background leakage current is used to set the pass/fail limit for determining device defects (i.e. in the prior art the pass/fail limit is set several standard deviations larger than the mean background leakage current). Since an average background leakage current is used, those devices with a background leakage current much less than the mean that still contain a defect may not be screened out because the background defect current and the defect current combined may not exceed the mean background leakage current or the pass/fail limit set by using such a mean. Also, those devices with a background leakage current much larger than the mean that do not contain a defect, but still exceed the mean background leakage current or the pass/fail limit set by using such a mean, are screened out as being defective, when they are actually good devices.

As the variability of the devices will change with the number of wafers being tested, so too will the average of that variability. The more devices you test the more the average will change either higher or lower depending upon the background leakage current measured in each device. Some prior art methods have tried to combat this problem by trying to lower the average background leakage using low temperature testing or by using multiple power grids. Each of these methods have significant disadvantages.

For example, in order for low temperature testing to be effective, the temperature would have to be brought very low. Significantly lowering the temperature of a wafer in a device may cause problems in future processing and could cause condensation in some of the devices so that they would not work later. Using multiple power grids imposes difficulty for device design because of the need to expand pin count to match background leakage. Multiple power grids also pose noise problems due to use of multiple $V_{cc}$ busses.

Thus, what is needed is a method for IDDQ testing which takes into account not only the magnitude of the background leakage currents, but also the variability from device to device of the background leakage current.

SUMMARY AND OBJECTS OF THE INVENTION

The present invention describes methods for IDDQ testing to detect defects in a semiconductor device. One embodiment of the present invention, measures a quiescent current at a first temperature $T_1$, then measures another quiescent current and a second temperature $T_2$. Based upon the quiescent current measured at $T_1$, the quiescent current at $T_2$, and knowing the temperature $T_1$ and temperature $T_2$, the component of the quiescent current associated with the defect current may be calculated. It is then determined if this component associated with the defect current meets a screen condition.

Another embodiment of the present invention measures a quiescent current at a first voltage $V_1$ and measures a second quiescent current at a second voltage $V_2$. Based upon the first quiescent current measured at $V_1$, and the second quiescent current measured at $V_2$ and knowing the first voltage $V_1$ and the second voltage $V_2$, the component of the quiescent current associated with the defect may be calculated. It is then determined if this defect current meets a screen condition.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which:

FIG. 4 illustrates a flow chart of one embodiment of the present invention.

DETAILED DESCRIPTION

Figure 1:
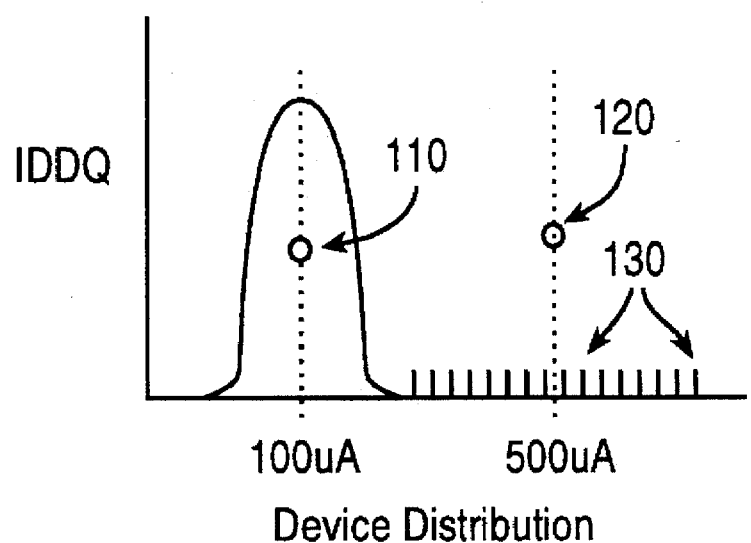
FIG. 1 illustrates a prior technique for detecting defects in a semiconductor device.
Figure 2:
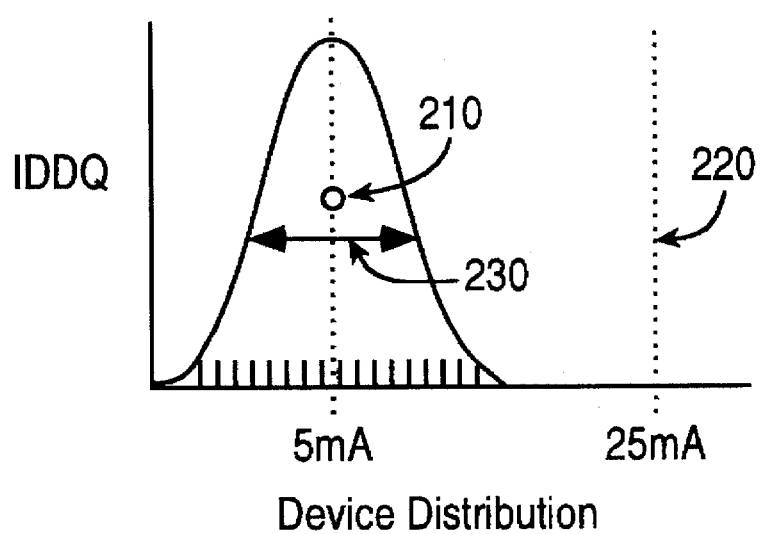
FIG. 2 illustrates a prior technique in FIG. 1 for detecting devices in sub-micron devices.
Figure 3A:
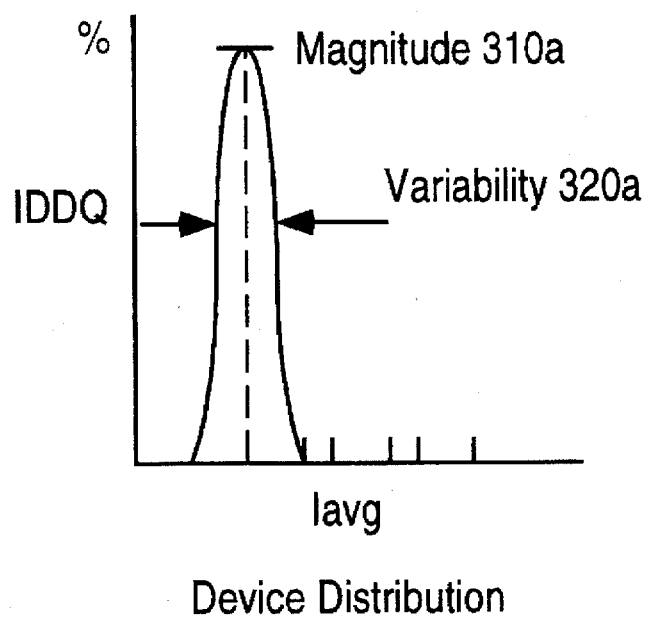
FIGS. 3a and 3b illustrate the variability of the background leakage current depending upon the number of devices tested.
Figure 3B:
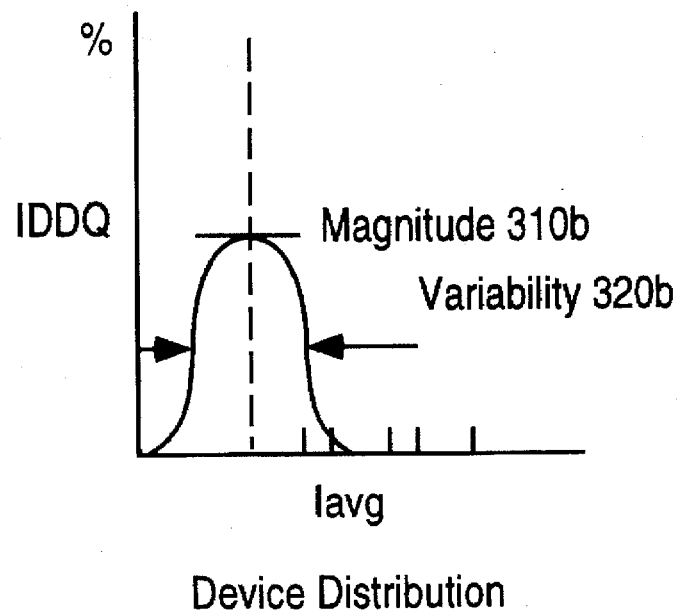

A method for Background Leakage Zeroing By Temperature And Voltage Dependence For IDDQ Measurement and Defect Resolution is disclosed. In the following description, numerous specific details are set forth such as specific devices, device characteristics, components, percentages, equations, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for detection and resolution of device defects in semiconductor devices. As device characteristics of semiconductors become smaller and more dense, testing the circuitry of such devices for defects becomes much harder. As stated in the background of the invention, it is important to have methods for detecting device defects that account for larger background leakage currents and/or the variability of background leakage currents from wafer to wafer.

One embodiment of the present invention deals with the problem of variability in the background leakage current by removing the dependence on knowing the magnitude of the background leakage current in detecting device defects. Instead, this embodiment of the present invention determines the amount of the total measured current which is associated with the defect current as a function of temperature and/or voltage. Because the background leakage voltage is dependent upon temperature and/or voltage, it is expected that by changing the temperature (or voltage) the background leakage current will change. Thus, the variability method uses the fact that the background leakage current varies based on voltage and/or temperature and builds this variation into the determination of the magnitude of the defect current. This embodiment is hereinafter referred to as the Variability Method.

The variability method of the present invention relies upon the dependence of the background leakage current on temperature and/or voltage as illustrated by the Arrhenius relationship:

$$I_b(T_n) = I e^{-\frac{q}{kT_n}} , \tag{1}$$

where $I_b$ is the background leakage current, k is a constant, q is the activation energy of the Arrhenius behavior, T is the temperature, and n is an integer. Although the background leakage current above is expressed as a function of temperature, it should be noted and it will be obvious to one with ordinary skill in the art that, the background leakage current may be expressed as a function of voltage. For example, the background leakage current as a function of voltage may be illustrated by the Arrhenius relationship:

$$I_b(V_n) = Ie^{\frac{qV_n}{k}}. \quad (2)$$

Since it is known that the total measured current (I) will have two components: one, the background leakage current ($I_b$) and the other, the current associated with a defect (or defect current, $I_d$) if a defect exists, then the total measured current may be expressed as:

$$I(T_n) = I_d + I_b, \quad (3)$$

or $$I(T_n) = I_d + Ie^{-\frac{q}{kT_n}}. \quad (4)$$

The magnitude of the defect current for a device may be determined without knowing the exact background leakage current by taking two IDDQ measurements, one at $T_1$ (or $V_1$) and another at $T_2$ (or $V_2$), inserting the values into equation (4) above, cross multiplying, and solving for $I_d$. For example the total measured current at $T_1$ and $T_2$ would look like:

$$I(T_1) = I_d + Ie^{-\frac{q}{kT_1}}, \quad (5)$$

and $$I(T_2) = I_d + Ie^{-\frac{q}{kT_2}}. \quad (6)$$

$I_d$ is subtracted from each side of equations 5 and 6 and then the two equations are cross multiplied to obtain:

$$[I(T_1) - I_d]e^{-\frac{q}{kT_2}} = [I(T_2) - I_d]e^{-\frac{q}{kT_1}}. \quad (7)$$

Next, equation 7 is solved for $I_d$, to obtain:

$$I_d = \alpha I(T_1) - \beta I(T_2), \quad (8)$$

wherein $I_d$ is the defect current, $I(T_1)$ is the quiescent current as a function of the first temperature, $I(T_2)$ is the quiescent current as a function of the second temperature, $$\alpha = \frac{e^{-\frac{q}{kT_2}}}{\left(e^{-\frac{q}{kT_2}} - e^{-\frac{q}{kT_1}}\right)}, \beta = \frac{e^{-\frac{q}{kT_1}}}{\left(e^{-\frac{q}{kT_2}} - e^{-\frac{q}{kT_1}}\right)}, \quad (9,10)$$

where q is the activation energy of the Arrhenius behavior, and k is a constant.

By taking two current measurements at different temperatures (or voltages) a defect current can be isolated from the background leakage current. In other words, the current due to a defect can be determined (or resolved) without determining the variability of the background leakage current from wafer to wafer or device to device. Instead, the variability of the magnitude of the background leakage current from device to device is factored out by building in the variability of the background leakage current due to temperature (or voltage) of the same device. Thus, rather than comparing the quiescent current (IDDQ) to a screen condition (or pass/fail limit) to determine if a device is good or defective, the present invention compares the actual defect current ($I_d$) to a screen condition, thereby eliminating the variation in background leakage from wafer to wafer.

It should be noted and it will be obvious to one with ordinary skill in the art that, similar reasoning may be used to determine the defect current, $I_d$, as a function of voltage, such that:

$$I_d = \alpha I(V_1) - \beta I(V_2), \quad (11)$$

wherein $I_d$ is the defect current, $I(V_1)$ is the quiescent current as a function of the first voltage, $I(V_2)$ is the quiescent current as a function of the second voltage, $$\alpha = \frac{e^{\frac{qV_2}{k}}}{\left(e^{\frac{qV_2}{k}} - e^{\frac{qV_1}{k}}\right)}, \beta = \frac{e^{\frac{qV_1}{k}}}{\left(e^{\frac{qV_2}{k}} - e^{\frac{qV_1}{k}}\right)}, \quad (12,13)$$

where q is the activation energy of the Arrhenius behavior, and k is a constant.

FIG. 4 illustrates a flow chart of one embodiment of the present invention. At step 410, a first quiescent current ($IDDQ_1$) at a first temperature ($T_1$), or first voltage ($V_1$), is measured. At step 420, a second quiescent current ($IDDQ_2$) at a second temperature ($T_2$), or second voltage ($V_2$), is measured. These measurements are then used to determine the defect current ($I_d$), at step 430. By inserting these measurements into Equation 8 or 11, given above (for temperature or voltage, respectively), the defect current ($I_d$) may be calculated. Once the defect current ($I_d$) is determined it is compared with a screen condition, at step 440.

The screen condition, also known as the pass/fail limit, in this embodiment is the magnitude of the defect current which a particular user can tolerate. For example, depending upon the device being tested, the intended use of that device, etc. a particular user can set a screen condition that exhibits a threshold tolerance of defects above which the particular device will not perform to the particular user's desired standards. Any defect current at or above the screen condition fails and is labeled a defective device (substep 441). Any defect current below the screen condition passes and is labeled a good device (substep 442).

It should be noted and it will be obvious to one with ordinary skill in the art that the order in which the steps of the present invention are performed may be altered while still achieving the desired results. Thus, the steps illustrated in the flow chart of FIG. 4 may be performed in other orders and/or simultaneously, and FIG. 4 is meant to be merely illustrative and not limiting.

Thus, a method for Background Leakage Zeroing By Temperature And Voltage Dependence For IDDQ Measurement and Defect Resolution has been described. Although specific embodiments, including specific devices, parameters, methods, and components have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. Method for detecting defects in a semiconductor device comprising the steps of:

measuring a first quiescent current at a first temperature;

measuring a second quiescent current at a second temperature, wherein said second temperature is different from said first temperature;

calculating, based on said first quiescent current and said second quiescent current and said first temperature and said second temperature, the component of said first and second quiescent currents corresponding to a defect current; and determining if said device is defective by comparing said defect current to a screen condition.

2. The method as described in claim 1 wherein the component of said first and second quiescent currents corresponding to said defect current is calculated using the following:

$$I_d = \alpha I(T_1) - \beta I(T_2),$$

wherein $I_d$ is the defect current, $I(T_1)$ is the quiescent current as a function of the first temperature, $I(T_2)$ is the quiescent current as a function of the second temperature, $$\alpha = \frac{e^{-\frac{q}{kT_2}}}{\left(e^{-\frac{q}{kT_2}} - e^{-\frac{q}{kT_1}}\right)}, \beta = \frac{e^{-\frac{q}{kT_1}}}{\left(e^{-\frac{q}{kT_2}} - e^{-\frac{q}{kT_1}}\right)},$$

where q is the activation energy of the Arrhenius behavior and k is a constant.

3. The method of claim 1 wherein said device is determined to be defective if said defect current is greater than or equal to said screen condition and said device is determined to be good if said defect current is less than said screen condition.

* * * * *